(12) United States Patent
Choi et al.

(10) Patent No.: US 9,952,510 B2
(45) Date of Patent: Apr. 24, 2018

(54) THINNER COMPOSITION

(71) Applicant: DONGWOO FINE-CHEM CO., LTD., Jeollabuk-do (KR)

(72) Inventors: Cheol Min Choi, Jeollabuk-do (KR); In Kak Song, Daejeon (KR); Kyong Ho Lee, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 51 days.

(21) Appl. No.: 15/016,524

(22) Filed: Feb. 5, 2016

(65) Prior Publication Data
US 2016/0230129 A1 Aug. 11, 2016

(30) Foreign Application Priority Data
Feb. 6, 2015 (KR) .................. 10-2015-0018510

(51) Int. Cl.
*C11D 3/20* (2006.01)
*G03F 7/16* (2006.01)

(52) U.S. Cl.
CPC .............. *G03F 7/168* (2013.01); *G03F 7/162* (2013.01)

(58) Field of Classification Search
CPC .............................. C11D 7/50; C11D 11/0047
USPC .................................................. 510/175, 176
See application file for complete search history.

(56) References Cited

U.S. PATENT DOCUMENTS

| 6,183,942 B1 * | 2/2001 | Kim | G03F 7/168 134/1.3 |
| 9,274,428 B2 * | 3/2016 | Hatakeyama | C08F 212/14 |
| 9,589,788 B2 * | 3/2017 | Jung | H01L 21/02118 |
| 2002/0192983 A1 * | 12/2002 | Shono | G03F 7/091 438/780 |
| 2004/0144753 A1 * | 7/2004 | Kang | G03F 7/0236 216/42 |
| 2005/0074695 A1 * | 4/2005 | Nakamura | G03F 7/091 430/271.1 |
| 2005/0089790 A1 * | 4/2005 | Lee | G03F 7/0048 430/141 |
| 2006/0008728 A1 * | 1/2006 | Kang | G03F 7/0007 430/141 |
| 2007/0087951 A1 * | 4/2007 | Lee | G03F 7/16 510/176 |
| 2009/0253080 A1 * | 10/2009 | Dammel | G03F 7/40 430/324 |
| 2009/0253081 A1 * | 10/2009 | Abdallah | G03F 7/40 430/324 |
| 2013/0048604 A1 * | 2/2013 | Kang | G03F 7/0045 216/49 |

(Continued)

FOREIGN PATENT DOCUMENTS

| KR | 10-0308422 B1 | 9/2001 |
| KR | 10-2011-0021189 A | 3/2011 |
| KR | 10-1132618 B1 | 4/2012 |

*Primary Examiner* — Gregory Webb
(74) *Attorney, Agent, or Firm* — The PL Law Group, PLLC

(57) ABSTRACT

A thinner composition includes propyleneglycol C1-C10 alkylether, C1-C10 alkyl C1-C10 alkoxy propionate, and C1-C10 alkyl lactate, thereby is it possible to improve applicability of a photoresist while remarkably reducing an amount of the used photoresist, as well as having excellent solubility and EBR property to various photoresists, BARCs and underlayers.

7 Claims, 3 Drawing Sheets

(56) References Cited

U.S. PATENT DOCUMENTS

2013/0065179 A1* 3/2013 Maeda ................. G03F 7/2041
　　　　　　　　　　　　　　　　　　　　　　430/270.1
2013/0078580 A1* 3/2013 Yun ....................... G03F 7/168
　　　　　　　　　　　　　　　　　　　　　　430/449

* cited by examiner

THINNER COMPOSITION

CROSS-REFERENCE TO RELATED APPLICATION

This application claims priority to and the benefit of Korean Patent Application No. 10-2015-0018510, filed on Feb. 6, 2015, the disclosure of which is incorporated herein by reference in its entirety.

BACKGROUND

1. Field of the Invention

The present invention relates to a thinner composition.

2. Description of the Related Art

A photolithography process in a method for manufacturing a semiconductor device is one of important works, which includes applying a photosensitive resin composition to a wafer, transferring a pre-designed pattern thereto, and then suitably etching according to transferred pattern to thus form an electronic circuit.

Such a photolithography process may be sequentially conducted by: (1) a coating process of uniformly applying a photosensitive resin composition to a surface of the wafer; (2) a soft baking process of evaporating a solvent from the applied photosensitive film to adhere the photosensitive film on the surface of the wafer; (3) an exposure process of exposing the photosensitive film while repeatedly and sequentially conducting reduction projection of the circuit pattern on a mask using a light source such as ultraviolet rays, to thus transfer the pattern of the mask to the photosensitive film; (4) a development process of selectively removing some portions having different physical properties such as a difference in solubility occurred due to sensitization by exposure to the light source, using a developer; (5) a hard baking process of closely fixing the photosensitive film, which remains on the wafer after the development, to the wafer; (6) an etching process of etching a predetermined portion according to patterns of the developed photosensitive film; and (7) a stripping process of removing unnecessary photosensitive film after the above processes, in this order.

Among the above photolithography processes, the spin coating process of providing the photosensitive film on a wafer and rotating the substrate to evenly spread the photosensitive film on the surface by a centrifugal force, may cause the photosensitive film to be gathered at an edge portion and a rear portion of the substrate due to the centrifugal force, to thus form a small spherical material. The spherical material may be peeled off during delivery of the substrate after the baking process, hence becoming a cause of particles in the apparatus, and also becoming a cause of defocus during exposure. Such unnecessary photosensitive material may bring about contamination of an apparatus, hence reducing yield in the process for manufacturing the semiconductor device. Therefore, the unnecessary photosensitive material is usually removed by installing injection nozzles at up and down of the edge portion and the rear portion of the substrate and injecting a thinner composition including an organic solvent component to the edge portion and the rear portion through the injection nozzles.

Factors of determining the performance of the thinner composition may include a rate of dissolution ('dissolution rate') and volatility thereof. The dissolution rate of the thinner composition determines how quickly and effectively dissolves and removes the photosensitive resin by the thinner composition, therefore, is very important factor. Specifically, when rinsing the edge portion of the substrate, a suitable dissolution rate is required to provide a smoothly treated cross-section. If the dissolution rate is too high, a photosensitive film attack may occur in rinsing the photosensitive film coated on the substrate. On the other hand, if the dissolution rate is too low, a so-called 'tailing phenomenon,' which is a phenomenon of flowing a partially dissolved photosensitive film tail, may occur in rinsing the photosensitive film coated on the substrate. In particular, since a diameter of the substrate is recently increased due to high integration and high densification of semiconductor integrated circuits, low revolution (rpm) of a rotational velocity is unavoidable in a case of a rinsing process using a spin coater. In such a rinsing process, if a fluctuation occurs in the substrate due to the low revolution and the dissolution rate is not suitable within a contact rate of the thinner composition under injection, a bounding phenomenon may occur, and use of the thinner composition may be unnecessarily increased. As such, in the case of the low revolution rinsing process due to an increase in diameter of the substrate, it is necessary for the thinner to have a higher dissolution rate than any conventional high revolution rinsing process.

In addition, after removing the photosensitive resin, it is necessary for the thinner composition to be easily volatilized, and do not remain on the surface of a substrate. If the thinner composition cannot be volatilized but remain due to a very low volatility, the thinner residue itself may act as a contaminant in different processes, especially, a subsequent etching process, to cause a problem of decreasing the yield of semiconductor devices. On the other hand, if the volatility is too high, the substrate is quickly cooled to more increase a deviation in a thicknesses of the coated photosensitive film, and the thinner may be easily volatilized into the atmosphere during use, thus causing a reduction in cleanliness.

Currently, i-line photoresist, KrF, ArF, EUV, KrF anti-reflection film, ArF anti-reflection film, and the like used as a photoresist in the semiconductor lithography process include different major components, respectively. Accordingly, controlling a content of an organic solvent for improving the solubility and applicability of these all components is required.

Korean Patent Laid-Open Publication No. 2011-21189 discloses a thinner composition including a hydrogen-bondable organic solvent, glycols, esters, and the like. In this regard, the composition has advantages of reducing an applying amount of photoresist, enabling uniform coating of the photoresist, and effectively removing unnecessary photoresist applied to a peripheral portion or a rear portion of the substrate. However, due to the hydrogen bond, a viscosity of the thinner is increased but volatility is deteriorated to prevent volatilization of the thinner and remain the same on the substrate, hence leading to the tailing phenomenon at a photoresist removal interface. Furthermore, the thinner residue may act as obstructive particles in the subsequent process to cause a problem of reducing productivity of the production process.

Accordingly, there is a need for a thinner composition to have excellent solubility to various photoresist films, bottom anti-reflection coatings (BARCs), and underlayers, as well as favorable volatility, so as to exhibit excellent coating ability in applying photoresist, and thereby reducing an amount of the used photoresist.

SUMMARY

It is an object of the present invention to provide a thinner composition for a pre-treatment process of a wafer surface, in order to improve performance of photoresist application and reduce an amount of the used photoresist.

Another object of the present invention is to provide a thinner composition having excellent solubility and (edge based removing) EBR property to various photoresists, BARCs, and underlayers, and also exhibiting excellent features in a reworking process (rework) of a wafer in which the photoresist is used.

The above objects of the present invention will be achieved by the following characteristics:

(1) A thinner composition including: propyleneglycol C1-C10 alkylether; C1-C10 alkyl C1-C10 alkoxy propionate; and C1-C10 alkyl lactate.

(2) The thinner composition according to the above (1), wherein the propyleneglycol C1-C10 alkylether is at least one selected from a group consisting of propyleneglycol methylether, propyleneglycol ethylether, propyleneglycol propylether and propyleneglycol butylether.

(3) The thinner composition according to the above (1), wherein the C1-C10 alkyl C1-C10 alkoxy propionate is at least one selected from a group consisting of methylmethoxy propionate, methylethoxy propionate, ethylmethoxy propionate and ethylethoxy propionate.

(4) The thinner composition according to the above (1), wherein the C1-C10 alkyl lactate is at least one selected from a group consisting of methyl lactate, ethyl lactate, propyl lactate and butyl lactate.

(5) The thinner composition according to the above (1), wherein 40 to 80% by weight of propyleneglycol C1-C10 alkylether, 15 to 50% by weight of C1-C10 alkyl C1-C10 alkoxy propionate, and 1 to 20% by weight of C1-C10 alkyl lactate.

(6) The thinner composition according to the above (1), wherein 50 to 70% by weight of propyleneglycol, 20 to 40% by weight of C1-C10 alkyl C1-C10 alkoxy propionate, and 5 to 15% by weight of C1-C10 alkyl lactate.

(7) A method for treatment of a substrate using the thinner composition according to the above (1) before applying a photoresist to the substrate.

(8) A method for treatment of a substrate using the thinner composition according to the above (1) after applying a photoresist to the substrate and before exposure of the same.

The thinner composition of the present invention is pre-treated on the surface of a wafer before application of a photoresist to remarkably reduce an amount of the used photoresist (a reducing resist coating (RRC) performance), and improves applicability of the photoresist to thus enable uniform coating thereof.

The thinner composition of the present invention has excellent solubility and EBR property to various photoresists, BARCs and underlayers. Therefore, the inventive thinner composition may be used in a reworking process of a wafer in which the photoresist is used.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
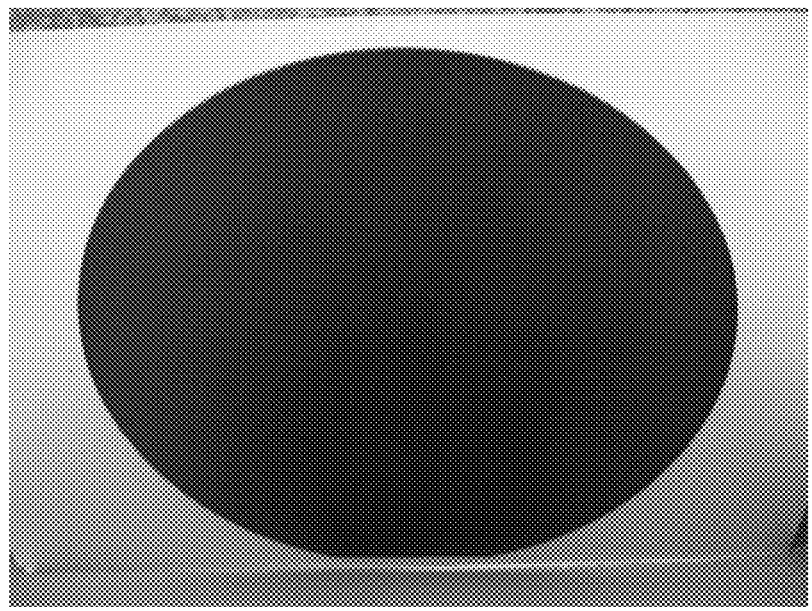
FIG. 1 is a photograph showing 99% or more coating of a photoresist on a wafer by applying the thinner composition in Example 3 to a wafer, and then applying the photoresist thereto.

The present invention provides a thinner composition including: propyleneglycol C1-C10 alkylether; C1-C10 alkyl C1-C10 alkoxy propionate; and C1-C10 alkyl lactate, thereby is it possible to improve applicability of a photoresist while remarkably reducing an amount of the used photoresist, as well as having excellent solubility and EBR property to various photoresists, BARCs and underlayers.

Hereinafter, the present invention will be described in detail.

The thinner composition of the present invention may include propyleneglycol C1-C10 alkylether; C1-C10 alkyl C1-C10 alkoxy propionate; and C1-C10 alkyl lactate.

The propyleneglycol C1-C10 alkylether is a component having excellent solubility to a polymer, in turn, exhibiting excellent solubility to the photoresist.

Propyleneglycol monomethylether acetate commonly used for the thinner composition shows reproductive toxicity, and has a high boiling point, therefore, requires a large amount of calories when using in a recycling process of a substrate. However, propyleneglycol C1-C10 alkylether does not have reproductive toxicity but has superior solubility to the photoresist.

The propyleneglycol C1-C10 alkylether is not particularly limited in types thereof so long as an alkyl group having 1 to 10 carbon atoms is contained. For example, propyleneglycol methylether, propyleneglycol ethylether, propyleneglycol propylether, propyleneglycol butylether, etc. may be used. Preferably, propyleneglylcol methylether is used. These compounds may be used alone or in combination of two or more thereof.

A content of propyleneglycol C1-C10 alkylether is not particularly limited but, for example, may be included in an amount of 40 to 80 wt. %, preferably, 50 to 70 wt. %, and more preferably, 55 to 65 wt. % to a total weight of the composition. If the content of propyleneglycol C1-C10 alkylether is less than 40 wt. %, a volatility of the composition is decreased and the thinner composition may remain on the substrate to hence contaminate the same. Further, the solubility to the photoresist is reduced, an RRC performance may be deteriorated, and an EBR performance may also be deteriorated. As a result, a reworking performance and applicability of the photoresist may be reduced. If the content of the above compound exceeds 80 wt. %, the volatility of the composition is increased, and as the thinner composition is volatilized, the substrate is quickly cooled to hence reduce the applicability of the photoresist and deteriorate the RRC performance. Further, the thinner composition does not sufficiently dilute the photoresist, BARC, etc.

to deteriorate the EBR performance. As a result, similar to the above case, the reworking performance and applicability of the photoresist may be reduced.

C1-C10 alkyl C1-C10 alkoxy propionate has high solubility to the photoresist and, when using this compound together with propyleneglycol C1-C10 alkylether, unpleasant odor of propyleneglycol C1-C10 alkylether may be reduced.

C1-C10 alkyl C1-C10 alkoxy propionate is not particularly limited in types thereof so long as an alkyl group having 1 to 10 carbon atoms and an alkoxy group having 1 to 10 carbon atoms are contained. For example, methylmethoxy propionate, methylethoxy propionate, ethylmethoxy propionate, ethylethoxy propionate, etc. may be used. In an aspect of more excellent effects for improvement of the RRC and EBR performances, methylmethoxy propionate is preferably used. These compounds may be used alone or in combination of two or more thereof.

A content of C1-C10 alkyl C1-C10 alkoxy propionate is not particularly limited but, for example, may be included in an amount of 15 to 50 wt. %, preferably, 20 to 40 wt. %, and more preferably, 25 to 35 wt. % to a total weight of the composition. If the content of C1-C10 alkyl C1-C10 alkoxy propionate is less than 15 wt. %, effects of solubility improvement and reduction of unpleasant odor may be insignificant. Also, as the volatility of the thinner composition is increased, the substrate is quickly cooled to reduce the applicability of the photoresist. Further, the thinner composition does not sufficiently dilute the photoresist, BARC, etc. to deteriorate the RRC performance. As a result, the reworking performance and applicability of the photoresist may be reduced. If the content of the above compound exceeds 50 wt. %, the volatility of the thinner composition is decreased, and the thinner composition may remain on the substrate to deteriorate the RRC performance to the photoresist, BARC, etc. As a result, similar to the above case, the reworking performance and applicability of the photoresist may be reduced.

The C1-C10 alkyl lactate has remarkably excellent solubility to the photoresist and a high viscosity, thus enabling the thinner composition to have an appropriate viscosity.

The C1-C10 alkyl lactate is not particularly limited so long as an alkyl group having 1 to 10 carbon atoms is contained. For example, methyl lactate, ethyl lactate, propyl lactate, butyl lactate, etc. may be included. Preferably, ethyl lactate is used. These compounds may be used alone or in combination of two or more thereof.

A content of C1-C10 alkyl lactate is not particularly limited but, for example, may be included in an amount of 1 to 20 wt. %, preferably, 5 to 15 wt. %, and more preferably, 8 to 12 wt. % to a total weight of the composition. If the content of C1-C10 alkyl lactate is less than 1 wt. %, a viscosity of the composition is decreased and does not sufficiently dilute the photoresist, BARC, etc., the RRC performance may be deteriorated and the EBR performance may also be deteriorated. As a result, the reworking performance and applicability of the photoresist may be reduced. If the content of the above compound exceeds 20 wt. %, the viscosity is increased to reduce spreadability of the composition, therefore, the RRC performance may be deteriorated and the EBR performance may also be deteriorated. As a result, similar to the above case, the reworking performance and applicability of the photoresist may be reduced.

As described above, the present invention uses propyleneglycol C1-C10 alkylether together with C1-C10 alkyl C1-C10 alkoxy propionate, thus enabling the composition to have appropriate volatility and excellent solubility. Therefore, the RRC and EBR performances may be improved, and toxicity and unpleasant odor problems may be reduced. In addition, since the C1-C10 alkyl lactate is also used, the solubility may be more improved and the RRC and EBR performances may be remarkably improved by controlling the viscosity to an appropriate level. Further, the reworking performance and applicability of the photoresist may also be noticeably improved.

The thinner composition of the present invention exhibits superior effects in expressing uniform applying performance on a silicon wafer in regard to various photoresist films and BARCs and, at the same time, may show superior RRC, EBR properties and rework property based on excellent solubility. In particular, in the case of a photoresist for i-line, KrF, ArF, ArF immersion, etc., the photosensitive resin has different basic structures. Therefore, it is necessary to control a constitutional content of an organic solvent in order to enhance the applicability and solubility of these all components. However, the thinner composition of the present invention may exhibit excellent EBR and RRC performances to all of such various resists.

In addition, the present invention may provide a method for treatment of a substrate using the thinner composition according to the present invention.

The method for treatment of a substrate according to the present invention may include treating the substrate with the thinner composition, and applying the photoresist to the substrate.

After treating the substrate with the thinner composition, the photoresist is applied thereto. Accordingly, the substrate may be coated only using a small amount of photoresist, and thereby enhancing process costs and productivity.

Further, the step of treating the substrate according to the present invention may further include applying the photoresist after the treatment using the thinner composition, and then, treating again the substrate with the thinner composition before exposure.

Since the substrate is treated using the thinner composition in the above step, unnecessary photoresist applied at the peripheral portion or rear portion of the substrate may be quickly and effectively removed before exposure.

The method for treatment of a substrate according to the present invention may be applicable to any method for manufacturing a product having photoresist used therein, for example, a method for manufacturing an electronic device without particular limitation thereof. For example, the present inventive method may be used in a method for manufacturing a semiconductor device or a thin film transistor liquid crystal display device.

Hereinafter, preferred embodiments are proposed to more concretely describe the present invention. However, the following examples are only given for illustrating the present invention and those skilled in the art will obviously understand that various alterations and modifications are possible within the scope and spirit of the present invention. Such alterations and modifications are duly included in the appended claims.

EXAMPLES AND COMPARATIVE EXAMPLES

Thinner compositions having constitutional compositions and contents stated in Table 1 below have been prepared.

TABLE 1

| | Propyleneglycol alkylether (A) | | Alkylalkoxy propionate (B) | | Alkyl lactate (C) | | Other esters (D) | |
|---|---|---|---|---|---|---|---|---|
| | Component | Wt. part | Component | Wt. part | Component | Wt. part | Component | Wt. part |
| Example 1 | A-1 | 40 | B-1 | 50 | C-1 | 10 | — | — |
| Example 2 | A-1 | 50 | B-1 | 40 | C-1 | 10 | — | — |
| Example 3 | A-1 | 60 | B-1 | 30 | C-1 | 10 | — | — |
| Example 4 | A-1 | 70 | B-1 | 20 | C-1 | 10 | — | — |
| Example 5 | A-1 | 60 | B-1 | 35 | C-1 | 5 | — | — |
| Example 6 | A-1 | 60 | B-1 | 25 | C-1 | 15 | — | — |
| Example 7 | A-1 | 80 | B-1 | 15 | C-1 | 5 | — | — |
| Example 8 | A-1 | 50 | B-1 | 40 | C-2 | 10 | — | — |
| Comparative Example 1 | A-1 | 70 | B-1 | 30 | — | — | — | — |
| Comparative Example 2 | A-1 | 90 | B-1 | 10 | — | — | — | — |
| Comparative Example 3 | A-1 | 90 | — | — | C-1 | 10 | — | — |
| Comparative Example 4 | — | — | B-1 | 90 | C-1 | 10 | — | — |
| Comparative Example 5 | A-1 | 90 | B-1 | 5 | — | — | D-1 | 5 |
| Comparative Example 6 | A-1 | 85 | B-1 | 10 | — | — | D-1 | 5 |
| Comparative Example 7 | — | — | B-1 | 40 | — | — | D-2 | 60 |
| Comparative Example 8 | A-1 | 60 | — | — | C-1 | 10 | D-3 | 30 |
| Comparative Example 9 | A-1 | 60 | B-1 | 30 | — | — | D-4 | 10 |

A-1: Propylene glycol monomethyl ether
B-1: Methyl 3-methoxy propionate
C-1: Ethyl lactate
C-2: Methyl lactate
D-1: n-Butyl acetate
D-2: Propyleneglycol monomethylether acetate
D-3: Methyl 2-hydroxy isobutyrate
D-4: Propyleneglycol monomethylether propionate Experimental Example 1. Assessment of Reducing Resist Coating (RRC) Performance to Types of Photoresist and BARC Using the thinner component in each of the examples and comparative examples, the RRC performance to four types of photoresists and BARCs was tested. An RRC process including: applying each thinner composition to an 8-inch silicon oxide substrate under conditions stated in Table 3; applying five types of photoresists and BARCs thereto; and then, measuring a coating distribution and an amount of the above materials used, has been conducted. Further, in the case of BARC, the RRC process was conducted using each of the thinner compositions without heat treatment.

Table 4 shows a result of RRC performance evaluation by applying 0.5 cc of thinner to an 8-inch wafer, and then, applying 1.0 cc for PR1 to 4 and 0.4 cc for BARC, respectively. Standards for evaluation are as follows.

⊚: As a result of RRC, a wafer is coated with 99 to 100% of photoresist when the photoresist was applied to the 8-inch wafer after applying 0.5 cc of thinner thereto ○: As a result of RRC, a wafer is coated with 97 to 98% of photoresist when the photoresist was applied to the 8-inch wafer after applying 0.5 cc of thinner thereto Δ: As a result of RRC, a wafer is coated with 85 to 90% of photoresist when the photoresist was applied to the 8-inch wafer after applying 0.5 cc of thinner thereto X: As a result of RRC, a wafer is coated with less than 85% of photoresist only when the photoresist was applied to the 8-inch wafer after applying 0.5 cc of thinner thereto.

TABLE 2

| Section | PR type |
|---|---|
| PR 1 | PR for i-line |
| PR 2 | PR for KrF |
| PR 3 | PR for ArF |
| PR 4 | PR for ArF-immersion |
| BARC | BARC for ArF |

TABLE 3

| Step | Time (sec) | Speed (rpm) | Axel (rpm/sec) | Dispense (cc) |
|---|---|---|---|---|
| 1 | 2.5 | 0 | 10,000 | 0.5(Thinner) |
| 2 | 1.5 | 900 | 10,000 | 0 |
| 3 | 9.5 | 1500 | 10,000 | 0 |
| 4 | 5.0 | 600 | 10,000 | 0.5~1(PR) |
| 5 | 5.0 | 1500 | 10,000 | 0 |
| 6 | 10.0 | 1000 | 10,000 | 0 |

TABLE 4

| Section | PR 1 (1.0 cc) | PR 2 (1.0 cc) | PR 3 (1.0 cc) | PR 4 (1.0 cc) | BARC (0.4 cc) |
|---|---|---|---|---|---|
| Example 1 | ⊚ | ⊚ | ○ | ⊚ | ⊚ |
| Example 2 | ⊚ | ○ | ⊚ | ⊚ | ⊚ |
| Example 3 | ⊚ | ⊚ | ⊚ | ⊚ | ⊚ |

TABLE 4-continued

| Section | PR 1 (1.0 cc) | PR 2 (1.0 cc) | PR 3 (1.0 cc) | PR 4 (1.0 cc) | BARC (0.4 cc) |
|---|---|---|---|---|---|
| Example 4 | ◎ | ◎ | ◎ | ◎ | ◎ |
| Example 5 | ◎ | ◎ | ○ | ◎ | ◎ |
| Example 6 | ◎ | ◎ | ◎ | ○ | ◎ |
| Example 7 | ◎ | ○ | ○ | ◎ | ◎ |
| Example 8 | ○ | ○ | ◎ | ○ | ◎ |
| Comparative Example 1 | X | X | X | X | X |
| Comparative Example 2 | X | X | X | X | X |
| Comparative Example 3 | X | X | X | X | X |
| Comparative Example 4 | X | X | X | X | X |
| Comparative Example 5 | X | X | X | X | X |
| Comparative Example 6 | X | X | X | X | X |
| Comparative Example 7 | Δ | X | X | Δ | Δ |
| Comparative Example 8 | X | X | Δ | X | Δ |
| Comparative Example 9 | X | Δ | Δ | X | Δ |

Referring to Table 4, the thinner composition in each of the examples according to the present invention exhibited excellent RRC performance to all photosensitive films. Further, even when varying a rotational velocity condition (rpm) of RRC, substantially equal and excellent results were obtained.

Referring to FIG. 1, after applying the thinner composition in Example 3 to the wafer, the photoresist was applied thereto. It could be seen that 99% or more of the photoresist was applied to the wafer.

On the other hand, the thinner composition in each of the comparative examples showed insignificant improvement effects of applying performance of the photoresist or BARC.

Figure 2:
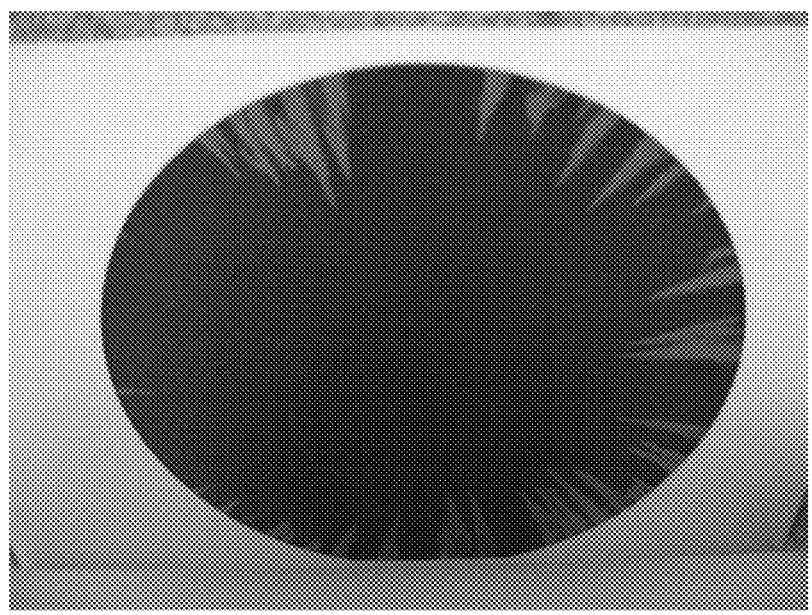
FIG. 2 is a photograph showing less than 85% coating of a photoresist on the wafer by applying the thinner composition in Comparative Example 1 to the wafer, and then applying the photoresist thereto.

Referring to FIG. 2, after applying the thinner composition in Comparative Example 1 to the wafer, the photoresist was applied thereto. It could be seen that less than 85% of the photoresist was applied to the wafer.

Experimental Example 2. Test for Removal of Unnecessary Photosensitive Film of Thinner Composition to Photoresist Resin Composition (Edge Bead Removing (EBR) Test)

EBR experiment was conducted as follows. Each of the photosensitive resin compositions stated in Table 2 below was applied to an 8-inch silicon oxide substrate. Thereafter, the thinner compositions in the examples and comparative examples were treated under the conditions stated in Table 5 to remove unnecessary photosensitive film at an edge portion of the substrate.

The thinner compositions in the examples and comparative examples were fed (1 kgf) from a pressurized barrel equipped with a pressure gauge, and a flow rate of the thinner composition from an EBR nozzle was set to be a range of 10 to 30 cc/min. Further, performance of removing the unnecessary photosensitive film was evaluated using an optical microscope. Results thereof are shown in Table 6 below. Standards for evaluation are as follows.

◎: After EBR, EBR line uniformity to the photosensitive film is greatly excellent.

○: After EBR, EBR line uniformity to the photosensitive film is 75% or more, which in turn, shows a favorable straight line state.

Δ: After EBR, the edge portion is distorted due to dissolution of the thinner.

X: After EBR, the film at the edge portion shows a tailing phenomenon.

TABLE 5

| Section | Rotational speed (rpm) | Time (Sec) |
|---|---|---|
| Dispense condition | 300~2000 | 7 |
| Spin coating | Controlled according to thickness of photosensitive film | 15 |
| EBR condition 1 | 2000 | 20 |
| EBR condition 2 | 2000 | 25 |
| Dry condition | 1300 | 6 |

TABLE 6

| Section | PR 1 | PR 2 | PR 3 | PR 4 | BARC |
|---|---|---|---|---|---|
| Example 1 | ◎ | ◎ | ◎ | ○ | ◎ |
| Example 2 | ○ | ◎ | ◎ | ◎ | ◎ |
| Example 3 | ◎ | ◎ | ◎ | ◎ | ◎ |
| Example 4 | ○ | ◎ | ◎ | ◎ | ◎ |
| Example 5 | ◎ | ◎ | ◎ | ○ | ◎ |
| Example 6 | ◎ | ◎ | ○ | ◎ | ◎ |
| Example 7 | ○ | ○ | ◎ | ○ | ◎ |
| Example 8 | ○ | ○ | ○ | ○ | ◎ |
| Comparative Example 1 | X | X | X | X | X |
| Comparative Example 2 | X | X | X | X | X |
| Comparative Example 3 | X | X | X | X | X |
| Comparative Example 4 | X | X | X | X | X |
| Comparative Example 5 | X | X | X | X | X |
| Comparative Example 6 | X | X | X | X | X |
| Comparative Example 7 | X | Δ | X | Δ | Δ |
| Comparative Example 8 | X | X | Δ | Δ | Δ |
| Comparative Example 9 | X | Δ | Δ | X | Δ |

Referring to Table 6, each of the thinner compositions in the examples shows excellent EBR performance to all photosensitive films. As a result, it could be understood that the EBR performances of four types of photoresists and BARCs are all satisfied. Further, even when varying the rotational velocity condition (rpm) of RRC, substantially equal and excellent results were obtained.

Figure 4:
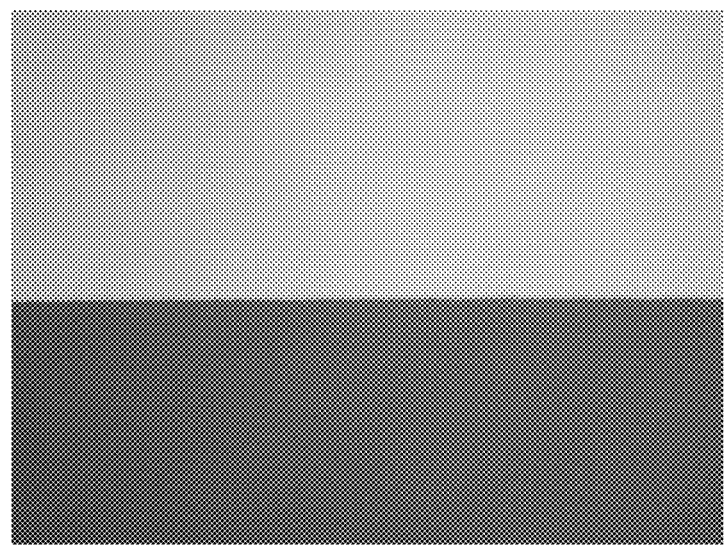
FIG. 4 is a photograph illustrating an EBR evaluation conducted using the thinner composition in Example 3.

Referring to FIG. 4, in the case of using the thinner composition in Example 3, it could be seen that EBR line uniformity is very excellent.

On the other hand, the thinner compositions in the comparative examples showed considerably reduced EBR performance.

Figure 5:
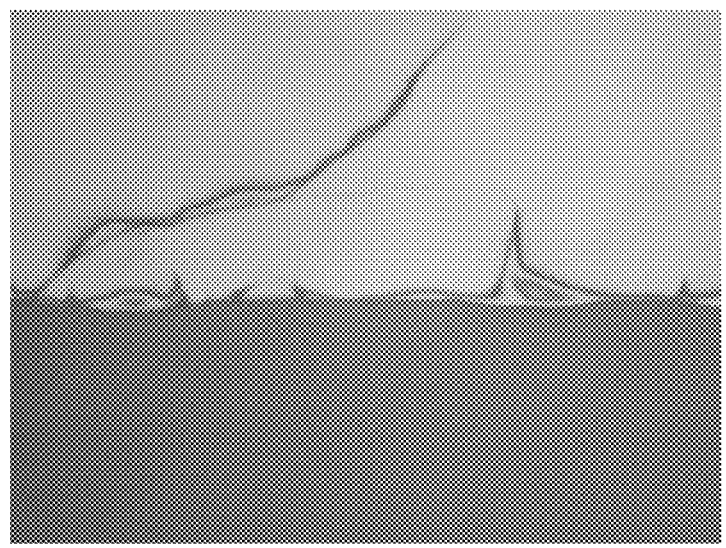
FIG. 5 is a photograph illustrating the EBR evaluation conducted using the thinner composition in Comparative Example 1.

Referring to FIG. 5, in the case of using the thinner composition in Comparative Example 1, it could be seen that the tailing phenomenon occurred on the film at the edge portion of the substrate.

Experimental Example 3. Assessment of Coating Uniformity According to Types of Photoresist Using the thinner compositions in the examples and comparative examples, coating uniformity to four types of photoresists and BARCs stated in Table 2 was examined.

Figure 3:
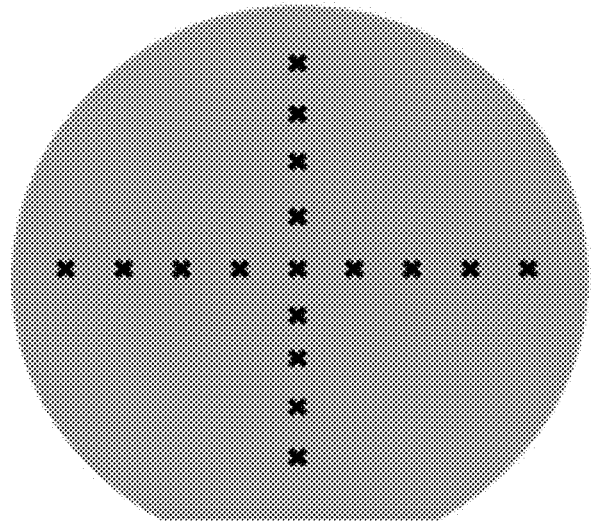
FIG. 3 is a diagram illustrating a point in which coating uniformity of the photoresist applied to the wafer was evaluated.

According to the conditions in Table 7, the thinner was applied to an 8-inch silicon oxide substrate, followed by applying the photoresist thereto. Then, total 17 points including 1 point at a center of the wafer and 16 points at 1 inch, 2 inch, 3 inch and 4 inch distances from the center of the wafer were marked in X shape (see FIG. 3) and subjected to measurement to identify whether the photoresist was uniformly applied. Results thereof are shown in Table 8 below.

Standards for evaluation are as follows.

⊚: 1% or less of standard deviation in thickness of coating film

○: 2% or less of standard deviation in thickness of coating film

Δ: 3% or less of standard deviation in thickness of coating film

X: more than 3% of standard deviation in thickness of coating film

TABLE 7

| Step | Time (sec) | Speed (rpm) | Axel (rpm/sec) | Dispense (cc) |
|---|---|---|---|---|
| 1 | 5 | 0 | 10,000 | 2.0 (Thinner) |
| 2 | 5 | 700 | 10,000 | 0 |
| 3 | 3 | 2,000 | 10,000 | 0 |
| 4 | 20 | 2,000 | 10,000 | 0.30 (PR) |
| 5 | 5 | 700 | 10,000 | 0 |
| 6 | 5 | 0 | 10,000 | 0 |

TABLE 8

| Section | PR 1 | PR 2 | PR 3 | PR 4 | BARC |
|---|---|---|---|---|---|
| Example 1 | ⊚ | ○ | ○ | ⊚ | ⊚ |
| Example 2 | ⊚ | ⊚ | ⊚ | ○ | ⊚ |
| Example 3 | ⊚ | ⊚ | ⊚ | ⊚ | ⊚ |
| Example 4 | ⊚ | ○ | ⊚ | ⊚ | ⊚ |
| Example 5 | ⊚ | ○ | ○ | ⊚ | ⊚ |
| Example 6 | ○ | ⊚ | ⊚ | ○ | ⊚ |
| Example 7 | ○ | ○ | ⊚ | ○ | ⊚ |
| Example 8 | ⊚ | ○ | ○ | ○ | ○ |
| Comparative Example 1 | X | X | X | X | X |
| Comparative Example 2 | X | X | Δ | Δ | X |
| Comparative Example 3 | X | X | X | X | X |
| Comparative Example 4 | X | X | Δ | X | X |
| Comparative Example 5 | X | X | X | Δ | X |
| Comparative Example 6 | X | X | X | X | X |
| Comparative Example 7 | Δ | Δ | X | Δ | Δ |
| Comparative Example 8 | X | X | Δ | Δ | Δ |
| Comparative Example 9 | Δ | Δ | Δ | X | Δ |

Referring to Table 8, in the case of applying the thinner composition in each of the examples, and then, applying the photoresist thereto, the standard deviation in a thickness of the photoresist film is very small to demonstrate uniform coating.

However, in the case of using the thinner composition in each of the comparative examples, the photoresist was not applied so as to have a uniform thickness.

Experimental Example 4. Assessment of Reworking Performance According to Types of Photoresist Using the thinner compositions in the examples and comparative examples, the reworking performance to four types of photoresists and BARCs stated in Table 2 was examined. According to the conditions stated in Table 9, 6 types of photoresists were applied to an 8-inch silicon oxide substrate, and then, the reworking process was conducted using each of the thinner compositions to the wafer obtained after a soft baking process. In the case of BARC, the reworking process was conducted using each of the thinner compositions in a state of non-heat treatment after the coating process.

The reworked silicon oxide substrate was subjected to assessment of surface condition using a surface scan apparatus (Model: WM-1500) available from Topcon Co. Results thereof are shown in Table 10.

Standards for evaluation are as follows.

⊚: As a result of surface scan, the number of surface particles of the reworked silicon oxide substrate is less than 1000.

○: As a result of surface scan, the number of surface particles of the reworked silicon oxide substrate ranges from 1000 to less than 2000.

Δ: As a result of surface scan, the number of surface particles of the reworked silicon oxide substrate ranges from 2000 to less than 3000.

X: As a result of surface scan, the number of surface particles of the reworked silicon oxide substrate is 3000 or more.

TABLE 9

| Step | Time (sec) | Speed (rpm) | Axel (rpm/sec) | Dispense (cc) |
|---|---|---|---|---|
| 1 | 2 | 0 | 10,000 | 0 |
| 2 | 2 | 1000 | 10,000 | 0 |
| 3 | 4 | 1000 | 10,000 | 2.0 (Thinner) |
| 4 | 9.5 | 4000 | 10,000 | 0 |
| 5 | 0 | 0 | 10,000 | 0 |

TABLE 10

| Section | PR 1 | PR 2 | PR 3 | PR 4 | BARC |
|---|---|---|---|---|---|
| Example 1 | ○ | ⊚ | ○ | ⊚ | ⊚ |
| Example 2 | ⊚ | ○ | ⊚ | ⊚ | ○ |
| Example 3 | ⊚ | ⊚ | ⊚ | ⊚ | ⊚ |
| Example 4 | ○ | ○ | ⊚ | ⊚ | ⊚ |
| Example 5 | ○ | ⊚ | ○ | ⊚ | ⊚ |
| Example 6 | ⊚ | ○ | ⊚ | ○ | ⊚ |
| Example 7 | ○ | ○ | ⊚ | ⊚ | ○ |
| Example 8 | ○ | ⊚ | ○ | ○ | ○ |
| Comparative Example 1 | X | X | X | X | X |
| Comparative Example 2 | X | X | Δ | Δ | Δ |
| Comparative Example 3 | X | X | X | X | X |
| Comparative Example 4 | X | X | X | Δ | X |
| Comparative Example 5 | X | X | Δ | X | X |
| Comparative Example 6 | X | X | X | X | Δ |
| Comparative Example 7 | Δ | X | X | Δ | Δ |

TABLE 10-continued

| Section | PR 1 | PR 2 | PR 3 | PR 4 | BARC |
|---|---|---|---|---|---|
| Comparative Example 8 | X | X | X | Δ | Δ |
| Comparative Example 9 | X | Δ | Δ | X | Δ |

Referring to Table 10, when using the thinner compositions according to the examples, the number of surface particles is very few to demonstrate excellent reworking performance.

However, when using the thinner compositions according to the comparative examples, it could be seen that numerous surface particles are remained.

What is claimed is:

1. A method for reducing a photoresist coating on a substrate, comprising:
   treating a substrate with a thinner composition;
   after the treating, applying a photoresist to the substrate, wherein the thinner composition comprising:
      propyleneglycol C1-C10 alkylether;
      C1-C10 alkyl C1-C10 alkoxy propionate; and
      C1-C10 alkyl lactate.

2. The method of claim 1, further comprising:
   after the applying, second-treating the substrate with the thinner composition; and
   exposing the second-treated substrate to a light source.

3. The method according to claim 1, wherein the propyleneglycol C1-C10 alkylether is at least one selected from a group consisting of propyleneglycol methylether, propyleneglycol ethylether, propyleneglycol propylether and propyleneglycol butylether.

4. The method according to claim 1, wherein the C1-C10 alkyl C1-C10 alkoxy propionate is at least one selected from a group consisting of methylmethoxy propionate, methylethoxy propionate, ethylmethoxy propionate and ethylethoxy propionate.

5. The method according to claim 1, wherein the C1-C10 alkyl lactate is at least one selected from a group consisting of methyl lactate, ethyl lactate, propyl lactate and butyl lactate.

6. The method according to claim 1, wherein the composition includes 40 to 80% by weight of the propyleneglycol C1-C10 alkylether, 15 to 50% by weight of the C1-C10 alkyl C1-C10 alkoxy propionate, and 1 to 20% by weight of the C1-C10 alkyl lactate.

7. The method according to claim 1, wherein the composition includes 50 to 70% by weight of the propyleneglycol C1-C10 alkylether, 20 to 40% by weight of the C1-C10 alkyl C1-C10 alkoxy propionate, and 5 to 15% by weight of the C1-C10 alkyl lactate.

* * * * *